United States Patent [19]

Sato

[11] 4,336,316

[45] Jun. 22, 1982

[54] IMAGE FORMING METHOD

[75] Inventor: Masamichi Sato, Asaka, Japan

[73] Assignee: Fuji Photo Film Co., Ltd., Kanagawa, Japan

[21] Appl. No.: 953,301

[22] Filed: Oct. 20, 1978

Related U.S. Application Data

[63] Continuation of Ser. No. 620,458, Oct. 7, 1975, abandoned.

[30] Foreign Application Priority Data

Oct. 7, 1974 [JP] Japan .................................. 49-115388

[51] Int. Cl.$^3$ ......................... G03C 5/04; G03C 5/00; G03C 5/30
[52] U.S. Cl. ............................................ 430/5; 430/8; 430/326; 430/330; 430/350; 430/353; 430/354
[58] Field of Search ............... 96/27 H, 36, 38.3, 36.2, 96/66 T; 430/350, 354, 353, 326, 330, 5, 8

[56] References Cited

U.S. PATENT DOCUMENTS

| | | |
|---|---|---|
| 992,898 | 5/1911 | Payne ........................................ 96/36 |
| 1,472,048 | 10/1923 | Christensen ............................... 96/36 |
| 1,709,569 | 4/1929 | Gorsky et al. ........................... 96/36 |
| 1,857,089 | 5/1932 | Sease ....................................... 96/59 |
| 3,468,664 | 9/1969 | Stewart .................................... 96/63 |
| 3,567,447 | 3/1971 | Chand ...................................... 96/36 |
| 3,592,649 | 7/1971 | Parsonage et al. ..................... 96/36 |
| 3,639,125 | 2/1972 | Chand ...................................... 96/36 |
| 3,664,837 | 5/1972 | Stanley ................................. 96/38.3 |
| 3,801,330 | 4/1974 | Brinckman et al. ................ 96/66 T |
| 3,850,635 | 11/1974 | Leavitt ................................. 96/66 T |

*Primary Examiner*—Richard L. Schilling
*Attorney, Agent, or Firm*—Sughrue, Mion, Zinn, Macpeak & Seas

[57] ABSTRACT

An image forming method comprising forming a silver image on a photographic material, which comprises a substrate having a silver halide-binder emulsion layer thereon, by exposing and developing the photographic material, heating the photographic material in a gaseous atmosphere containing oxygen until binder at developed silver image areas is substantially removed, and then dissolving away the image-forming silver to leave thermally decomposed binder at the non-silver image areas.

30 Claims, No Drawings

IMAGE FORMING METHOD

This is a continuation of application Ser. No. 620,458 filed Oct. 7, 1975, now abandoned.

BACKGROUND OF THE INVENTION

1. Field of the Invention

The present invention relates to a method for producing an image. More particularly, it relates to a novel method for producing a heat resistant, high contrast image having high resolving power using a photographic material which comprises a substrate having thereon at least one silver halide emulsion layer, either directly or on at least one subbing layer on the substrate. It also relates to a novel method for easily producing a durable photomask having high resolving power and good edge acuity using a photographic material which comprises a transparent substrate having a masking layer thereon, the masking layer having thereon at least one silver halide emulsion layer, either directly or on at least one subbing layer on the masking layer.

2. Description of the Prior Art

The optical density of a silver image formed on a photographic material by exposing and developing a photographic material which comprises a silver halide emulsion layer coated on a substrate gradually decreases from its maximum value to a background value at the edges of the silver image. The spacing between the maximum image density portion and the background is usually about 1 micron. Therefore, it is difficult to obtain a high contrast silver image having closely separated, e.g., about one micron, lines or spacings. Silver grains existing between adjacent image lines reduce the image contrast and resolving power.

Moreover, since such an emulsion layer is colored due to thermal decomposition of the binder when it is heated to about 150° to 200° C., it cannot be used where heat resistance is required.

One field which requires heat resistant images is "super-microphotography". An image reduced on a 35 mm film from a 9 by 14 inch (23 by 36 cm) size original with a reduction ratio of about 10 is usually called a "microphotograph", and an image further reduced (to about 2 by 3 mm) by a factor of about 10 is called a "super-microphotograph". A microphotograph can thus be considered to be an image reduced by a factor of about 10 and a super-microphotograph an image reduced by a factor of about 100.

Since the image size of a super-microphotograph is about 2 by 3 mm or smaller, the enlarging factor is about 100 (10,000 based on area ratio) when a super-microphotograph is projected on a screen to provide the original image size. Consequently, a light intensity of about 10 million lux is necessary on the image surface of the super-microphotograph if the image projected on a transmission type screen (e.g., with a blackened back surface) must have a light intensity of about 100 lux when the screen has a transmission optical density of 1. In fact, a super-microphotographic image is illuminated with a light intensity of about 12 to 13 million lux to compensate for the loss of the projection lens.

The temperature of the emulsion layer of a super-microphotograph increases to several hundred degrees C. due to heat generated by the light absorbed in the emulsion layer when a super-microphotograph is continuously illuminated with such strong light. As a result, the binder of the emulsion layer is thermally decomposed and colored, which causes the image projected on the screen to be dim and colored. Since the silver image areas absorb light well, the temperature of these areas preferentially increases and the binder in these areas is preferentially decomposed, whereafter decomposition spreads into surrounding areas. Decomposition of even the binder at non-silver image areas proceeds in an accelerated manner once the binder is slightly colored and light absorption occurs.

It was previously discovered that when an emulsion layer having a silver image therein was heated to about 400° to 600° C. in an oxygen containing gas, such as air, the black silver image turned to a metallic silver image with a mirror surface and the binder of the emulsion layer turned dark red-brown due to thermal decomposition. In a subsequent heating process (hereafter, the heating process is called "baking") in an oxygen containing gas, the binder was decomposed into oxide gases (e.g., $CO_2$, $H_2O$, $NO_2$ and $SO_2$) and was removed, and the optical density of the colored binder layer at the non-silver image areas gradually decreased. Also, the mirror surface of the silver image disappeared, probably due to migration of silver particles (probably silver atoms), and at the same time the silver image lost the ability to resolve lines of even about several microns, though the silver image resolved 1 micron lines before baking. It is believed that the silver atoms migrate from their original location to different locations because minute silver crystals are found at the image areas, and the periphery of the image areas, and because many pinholes and cracks occur in the silver image, which decrease the optical density of the baked silver image. In particular, the optical density of high density areas is reduced to a great extent, providing a partially reversed image.

Quite surprisingly, it has been found that decomposed binder remains at non-image areas after decomposed binder at image areas is substantially removed, and that the remaining decomposed binder image has high optical density, smooth edges and high contrast.

Heretofore, emulsion masks and hard masks have generally been used as photomasks for microelectronic manufacture. However, the emulsion mask has low edge contrast as described above and such low mechanical strength that it is easily damaged, that is, durability is poor. On the other hand, a hard mask is quite durable, but processes for the production thereof are complicated. Also, the production of hard masks requires a photoetching process that uses a photoresist which has low speed and requires long exposure times.

SUMMARY OF THE INVENTION

It is, therefore, an object of the present invention to provide a method for producing heat resistant and high contrast images having high resolving power.

Another object of the present invention is to provide a method for easily producing a durable photomask having high resolving power and good edge acuity.

The first object of the present invention can be attained by exposing and developing a photographic material which comprises a substrate having thereon at least one silver halide emulsion layer, either directly or on at least one subbing layer, to form a silver image, heating the photographic material in an oxygen containing gas until the binder at the silver image areas is substantially removed, and then dissolving away the image forming silver to leave thermally decomposed binder at the non-image areas.

The second object of the present invention can be attained by exposing and developing a photographic material which comprises a transparent substrate having a masking layer thereon, the masking layer having thereon at least one silver halide emulsion layer, either directly or on at least one subbing layer, on the masking layer, to form a silver image, heating the photographic material in an oxygen containing gas until the binder at the silver image areas is substantially removed, dissolving away the image forming silver, and then etching away the masking layer beneath the silver image.

DETAILED DESCRIPTION OF THE INVENTION

One type of photographic material of the present invention fundamentally comprises a heat resistant substrate having thereon a silver halide emulsion layer. If necessary, one or more subbing layers can be interposed between the substrate and the silver halide emulsion layer, for example, when the surface of the support is hydrophobic. Another type of photographic material of the present invention fundamentally comprises a heat resistant transparent substrate having thereon a masking layer and a silver halide emulsion layer. If necessary, at least one subbing layer can be interposed between the masking layer and the silver halide emulsion layer.

The term "heat resistant substrate" designates glass (e.g., silica glass, borosilicate glass, soda lime glass, barium glass, etc.), sapphire, and the like. Other useful heat resistant substrates include ceramics (e.g., hard porcelain, e.g., alumina porcelain, titanium porcelain, beryllia porcelain, mullite porcelain, talc porcelain, spinel porcelain, zircon porcelain, ferrite porcelain, etc., soft porcelain, e.g., fritted porcelain, Sevres porcelain, bone china, etc., earthenware, glazed and baked earthenware, etc.), cermets, e.g., $Al_2O_3$-Fe, TiC-Ni, etc., silica, metals (e.g., iron, copper, nickel, cobalt, aluminum, titanium, chromium, tungsten, molybdenum, gold, platinum, palladium, iridium, rhodium, ruthenium, zirconium, tantalum, hafnium, tellurium, a nickel-iron alloy, a nickel-chromium-iron alloy, an aluminum-iron alloy, a chromium-iron alloy, a chromium-aluminum alloy, a silicon-gold alloy, a titanium-aluminum alloy, a copper-beryllium alloy, a cobalt-iron alloy, a cobalt-nickel alloy, a nickel-chromium alloy, etc.), semi-metals such as silicon, germanium, etc., chalcogen glasses such as As-S-Ge, As-Se-Ge, Ge-S, etc., porcelain enamel (a metal covered with a glaze and then baked), metals having an oxide layer of the metal formed thereon, carbon fibers, graphite, and the like. Earthenware is generally considered to slightly absorb water whereas porcelain does not absorb water.

One requirement for the heat resistant substrate of baking the present invention is dimensional stability before and after. However, absolute dimensional stability is not required for certain end-uses of the image, for example, a super-microphotograph does not require strict dimensional stability, but a photomask for IC construction requires high dimensional stability.

The substrate for the photomask must in addition be transparent since transparency is a necessary condition for mask alignment, as is well known in the field of microelectronic construction.

The term "transparent substrate" as is used herein in the present invention designates a substrate which comprises a substance capable of transmitting not less than 50%, preferably not less than 70%, of electromagnetic waves in the near-ultraviolet (e.g., about 2,900 Å to 4,000 Å) and visible light regions (e.g., about 4,000 Å to 7,000 Å).

The substrates are preferably resistant to temperatures of at least about 350° C.

The masking layer is provided by depositing a masking material on a transparent heat resistant substrate using vacuum deposition, sputtering, ion plating, chemical plating or the like. Suitable masking materials are metal oxides such as silicon oxide, chromic oxide, ferric oxide, magnetic iron oxide (iron (II) iron (III) oxide), cuprous oxide, cupric oxide, nickel oxide, cobalt oxide, germanium oxide, cadmium oxide, titanium oxide, tantalum oxide, etc., metals such as chromium, aluminum, silver, titanium, cobalt, tungsten, tellurium, nickel, gold, platinum, iridium, palladium, rhodium, molybdenum, tantalum, a nickel-iron alloy, a nickel-chromium-iron alloy, an aluminum-iron alloy, a chromium-iron alloy, a chromium-aluminum alloy, a silicon-gold alloy, a titanium-aluminum alloy, a copper-beryllium alloy, a cobalt-iron alloy, a cobalt-nickel alloy, a nickel-chromium alloy, etc., semi-metals such as silicon, germanium, etc., chalcogen glasses such as As-S-Ge, As-Se-Ge, Ge-S, etc., a mixture thereof (e.g., chromium oxide on chromium, cobalt oxide on cobalt, silicon oxide on silicon, etc.). The masking material provides a masking effect, particularly to ultraviolet light, and is preferably selected from those materials which transmit visible light and absorb ultraviolet light.

The thickness of the masking layer cannot be set forth unequivocally since the thickness varies depending upon the end-use thereof. However, in general, a thickness ranging from about $0.01\mu$ to $10\mu$, preferably $0.07\mu$ to $1.5\mu$, is employed. If the thickness is too small, absorption of ultraviolet light is too small, while if the thickness is too large, the etching takes too much time and side etching arises, which is deleterious. Since a metal or metal oxide possesses much greater mechanical strength than a photographic emulsion layer or the like, the masking layer renders the photomask (support plus image-wise masking layer) scratch resistant.

The subbing layer used in the present invention is a layer which intimately adheres to both the substrate and the silver halide emulsion layer, or to both the masking layer and the silver halide emulsion layer. When the substrate or the masking layer differ highly in properties from the silver halide emulsion layer, two or more subbing layers can be employed, the subbing layers being selected so that they adhere well to the layer to which they are closest and, of course, to each other. Suitable subbing layers are gelatin, gelatin derivatives such as the later given water-soluble binders, albumin, casein, cellulose derivatives, starch derivatives such as the later given water-soluble binders, sodium alginate, polyvinyl alcohol, poly-N-vinyl pyrrolidone, polyacrylic acid copolymers such as the later given water-soluble binders, polyacrylamide, alcohol-soluble polyamide resins as described in Japanese Patent Publication 5509/64, a mixture of cellulose ester(s) and polyester(s) of terephthalic acid-glycols as described in Japanese Patent Publication 14503/68, a mixture of gelatin and nitrocellulose as described in Japanese Patent Publication 2597/69, compounds as described in Japanese Patent Publication 11616/71, homopolymers or copolymers of glycidyl (meth)acrylate as described in West German Patent (OLS) 2,001,727, etc. Also, a subbing layer formed by providing a thin polyvinyl acetate layer (for example, at a thickness of about 0.1 to $0.3\mu$) and bringing the surface into contact with an aqueous alkaline solution, such as an aqueous solution of sodium hydroxide for saponification, can be used. A suitable thickness for the subbing layer ranges from about 0.1 to about 0.5μ.

The silver halide emulsion used in the present invention can be obtained by dispersing one or more silver halides in a water-soluble binder. The weight ratio of silver halide to the water-soluble binder (dry weight) is preferably about 1:6 to about 6:1, though this is not limitative. Illustrative silver halides are silver chloride, silver bromide, silver iodide, silver chlorobromide, silver bromoiodide, silver chlorobromoiodide or a mixture thereof, etc. While any silver halide emulsion can be used, emulsions having silver halide grains smaller than 0.1μ are preferred to obtain higher resolving power. The grain size of the emulsion is not limited to such sizes as these are merely preferred.

A most typical silver halide emulsion is an emulsion which contains about 90 mol% or more silver bromide (preferably containing not more than about 5 mol% silver iodide) and contains silver halide grains of a mean grain size of not more than about 0.1μ (a so-called Lippmann emulsion), and in which the weight ratio of silver halide to the water-soluble binder is about 1:4 to about 6:1. Another example of a silver halide emulsion is an emulsion which contains about 50 mol% or more (preferably 70 mol%) silver chloride and contains silver halide grains of a mean grain size of not more than about 1.0μ.

Examples of water-soluble binders include gelatin (alkali treated gelatin, acid treated gelatin, enzyme treated gelatin, etc.), colloidal albumin, casein, cellulose derivatives (e.g., carboxymethyl cellulose, hydroxyethyl cellulose, etc.), saccharide derivatives (e.g., agar-agar, sodium alginate, starch derivatives, etc.), synthetic hydrophilic colloids (e.g., polyvinyl alcohol, poly-N-vinyl pyrrolidone, polyacrylic acid copolymers, polyacrylamide, derivatives thereof, etc.). If desired, a compatible mixture of two or more of these binders can be used. Of these, a most preferred binder is gelatin which can be replaced, partly or completely, by a synthetic high molecular weight substance, by a so-called gelatin derivative (prepared by processing gelatin with a compound having a group capable of reacting with the functional groups contained in the gelatin molecule, i.e., amino groups, imino groups, hydroxy groups or carboxy groups), or by a graft polymer prepared by grafting a molecular chain of some other high molecular weight substance onto the gelatin. Suitable compounds for preparing the gelatin derivatives are isocyanates, acid chlorides and acid anhydrides as described in U.S. Pat. No. 2,614,928, acid anhydrides as described in U.S. Pat. No. 3,118,766, bromoacetic acids as described in Japanese Patent No. 5514/64, phenyl glycidyl ethers as described in Japanese Patent No. 21845/67, vinyl sulfone compounds as described in U.S. Pat. No. 3,132,945, N-allylvinyl-sulfonamides as described in British Patent No. 861,414, maleinimide compounds as described in U.S. Pat. No. 3,186,846, acrylonitriles as described in U.S. Pat. No. 2,594,293, polyalkylene oxides as described in U.S. Pat. No. 3,312,553 epoxy compounds as described in Japanese Patent No. 26845/67, acid esters as described in U.S. Pat. No. 2,763,639, alkanesultones as described in British Pat. No. 1,033,189, etc. Descriptions of suitable branch high polymers to be grafted onto gelatin are given in U.S. Pat. Nos. 2,763,625, 2,831,767, 2,966,884, Polymer Letters, 5, 595 (1967), Phot. Sci. Eng., 9, 148 (1965), J. Polymer Sci. A-1, 9, 3199 (1971), and the like. Homopolymers or copolymers of compounds, which are generally called vinyl monomers, such as acrylic acid, methacrylic acid, the ester, amide and nitrile derivatives thereof, styrene, etc., are widely used for grafting to gelatin. Hydrophilic vinyl polymers having some compatibility with gelatin, such as homopolymers or copolymers of acrylic acid, acrylamide, methacrylamide, hydroxyalkyl acrylate, hydroxyalkyl methacrylate, etc., i.e., copolymers of these materials among themselves and copolymers of these materials with other comonomers, are particularly preferred.

These silver halide emulsions are advantageously optically sensitized with known optical sensitizers such as the cyanine dyes and merocyanine dyes as described in U.S. Pat. Nos. 1,346,301, 1,846,302, 1,942,854, 1,990,507, 2,493,747, 2,793,964, 2,493,748, 2,503,776, 2,519,001, 2,666,761, 2,734,900 and 2,739,149, and British Pat. No. 450,958.

The silver halide emulsion can be exposed to electromagnetic radiation to which the silver halide emulsion is sensitive, e.g., visible, ultraviolet, electron beam, X-ray, etc., radiation. With the optically sensitized photographic light-sensitive materials, it is convenient to use irradiation mainly having a wavelength corresponding to the optically sensitized region of the emulsion as the irradiation for exposing the emulsion layer.

The emulsion is advantageously chemically sensitized with salts of noble metals such as ruthenium, rhodium, palladium, iridium, platinum, etc., as described in U.S. Pat. Nos. 2,448,060, 2,566,245 and 2,566,263. Also, the emulsion can be chemically sensitized with a gold salt as described in U.S. Pat. No. 2,339,083 or stabilized with a gold salt as described in U.S. Pat. Nos. 2,597,856, 2,597,915. Furthermore, a thiopolymer as described in U.S. Pat. No. 3,046,129 can advantageously be incorporated in the emulsion. In addition, the emulsion can be stabilized with mercury compounds as described in U.S. Pat. No. 3,046,129, column 20, line 51 to column 21, line 3, triazoles, azaindenes, disulfides, quaternary benzothiazolium compounds, zinc salts and cadmium salts.

The emulsion can contain light-absorbing dyes as described in U.S. Pat. Nos. 2,527,583, 2,611,696, 3,247,127, 3,260,601, etc.

The emulsion is advantageously hardened with a suitable hardening agent for hydrophilic colloids, such as formaldehyde or a like hardener; N-methylol compounds as described in U.S. Pat. Nos. 2,732,316 and 2,586,168; carbodiimide compounds as described in U.S. Pat. No. 3,091,537; halogen-substituted fatty acids (e.g., mucochloric acid, mucobromic acid, etc.); compounds having a plurality of acid anhydride groups; methanesulfonic acid disester; dialdehydes or sodium bisulfate adducts thereof such as β-methylglutaraldehyde bis(sodium hydrogen sulfite) addition products; bisaziridinecarboxyamide (e.g., trimethylenebis(1-aziridinecarboxyamide)); triazine derivatives (e.g., 2-hydroxy-4,6-dichloro-S-triazine, etc.); and the like.

The silver halide emulsion is coated on the substrate or masking layer directly or after adding a coating aid as described in U.S. Pat. No. 3,046,129. The silver halide emulsion layer preferably has a thickness of about 0.3μ to about 10μ (dry basis) and can be coated in one or more layers on the masking layer or on one or both surfaces of the substrate. When two layers of the silver halide emulsion are used on one surface of the support, the total thickness is less than about 10μ, and when two layers are formed separately on both surfaces of the support, the total thickness is not more than about 20μ

(dry basis). When a silver halide emulsion is applied to both sides of the support, both emulsions can, of course, be subjected to processing in accordance with the present invention. The thickness of the emulsion layer is selected depending upon the end-use of the element.

If desired, a backing layer, an antihalation layer, an interlayer, an uppermost layer (e.g., a protective layer, etc.), and the like can be provided on the substrate, the masking layer or on the emulsion layer.

Formation of a silver image in the silver halide emulsion layer can be effected using conventional photographic processings, that is, by development processing the exposed emulsion layer and, if necessary, fixing. Conventional photographic processings including exposure, development, fixing, etc., which can be used are described in detail in "Techniques of Microphotography" *Kodak Data Book* P-52, Eastman Kodak Co., Rochester N.Y.

Developing agents which can be used in the method of the present invention for forming silver images are those well known in the art, and include developing agents such as the dihydroxybenzenes (e.g., hydroquinone, 2-chlorohydroquinone, 2-bromohydroquinone, 2-isopropylhydroquinone, toluhydroquinone, 2-phenylhydroquinone, 2,3-dichlorohydroquinone, 2,5-dimethylhydroquinone, pyrogallol, etc.), the 3-pyrazolidones (e.g., 1-phenyl-3-pyrazolidone, 1-phenyl-4-methyl-3-pyrazolidone, 1-phenyl-4,4-dimethyl-3-pyrazolidone, 1-phenyl-4-ethyl-3-pyrazolidone, 1-phenyl-5-methyl-3-pyrazolidone, etc.), the aminophenols (e.g., o-aminophenol, p-aminophenol, o-(methylamino)phenol, p-(methylamino)phenol, p-(diethylamino)phenol, 2,4-diaminophenol, p-(benzylamido)phenol, etc.), ascorbic acid, the 1-aryl-3-aminopyrazolines (e.g., 1-(p-hydroxyphenyl)-3-aminopyrazoline, 1-(p-methylaminophenyl)-3-pyrazoline, 1-(p-aminophenyl)-3-pyrazoline, 1-(p-amino-m-methylphenyl)-3-aminopyrazoline, etc.), N-(p-hydroxyphenyl)glycine, the compounds described as developing agents in C.E.K. Mees & T. H. James, *The Theory of the Photographic Process*, 3rd Edition, Chapter 13, Macmillan Co., New York (1966), L. F. A. Mason, *Photographic Processing Chemistry*, pp. 16-30, The Focal Press, London (1966), and mixtures thereof. The developer generally possesses a pH of not less than about 8, preferably about 8.5-12.5.

The developer can contain, if desired, an alkali agent (e.g., a hydroxide of an alkali metal or ammonium, carbonate, borate, etc.), a pH-adjusting agent or buffer (e.g., a weak acid or alkali such as acetic acid, boric acid, or salt thereof, etc.), a development promoting agent (e.g., pyridinium compounds and cationic compounds as described in U.S. Pat. Nos. 2,648,604 and 3,671,247, potassium nitrate, sodium nitrate, condensation products of polyethylene glycol and derivatives thereof as described in U.S. Pat. Nos. 2,533,990, 2,577,127, 2,950,970, nonionic compounds such as polythioethers represented by compounds as described in British Patents Nos. 1,020,033 and 1,020,032, pyridine, organic amines such as ethanolamine, benzyl alcohol, hydrazines, etc.), an antifogging agent (e.g., an alkali bromide, alkali iodide, nitrobenzimidazoles as described in U.S. Pat. No. 2,496,940 and mercaptobenzimidazole, 5-methylbenzotriazole, 1-phenyl-5-mercaptotetrazole, compounds for a rapid developing solution as described in U.S. Pat. Nos. 3,113,864, 3,342,596, 3,295,976, 3,615,522 and 3,597,199, thiosulfonyl compound as described in British Patent 972,211, phenazine-N-oxides as described in Japanese Patent Publication 41675/71, antifogging agents as described in *Kagaku Shashin Binran* (*Handbook of Scientific Photography*), Vol. 2, pp. 29-47, Maruzen, Tokyo (1959), etc.), stain or sludge preventing agents as described in U.S. Pat. Nos. 3,161,513 and 3,161,514, and British Pat. Nos. 1,030,442, 1,144,481, and 1,251,558, a preservative (e.g., a sulfite, an acid sulfite, hydroxylamine hydrochloride, formaldehyde-sulfite adduct, ethanolamine-sulfite adduct, etc.), a surface active agent, etc.

On the other hand, suitable fixing agents for the silver halide are the generally well known solvents for silver halides, such as a water-soluble thiosulfate (e.g., potassium thiosulfate, sodium thiosulfate, ammonium thiosulfate, etc.), a water-soluble thiocyanate (e.g., potassium thiocyanate, sodium thiocyanate, ammonium thiocyanate, etc.), a water-soluble organic diol (e.g., 3-thia-1,5-pentanediol, 3,6-dithia-1,8-octanediol, 3,6,9-trithia-1,11-undecanediol, 3,6,9,12-tetrathia-1,14-tetradecanediol, etc.), a water-soluble sulfur-containing organic dibasic acid (e.g., ethylenebisthioglycolic acid, etc.), a water-soluble salt thereof (e.g., potassium ethylenebisthioglycolate, sodium ethylenebisthioglycolate, etc.), and a mixture thereof.

The fixing agent containing solution can contain, if desired, a preservative (e.g., a sulfite, a bisulfite, etc.), a pH-buffer (e.g., boric acid, a borate, etc.), a pH-adjusting agent (e.g., acetic acid, etc.), a chelating agent, and the like.

A silver image is thus formed in the exposed areas, while in the unexposed areas silver halide is removed through fixation by essentially conventional procedures, the binder in the silver halide emulsion layer in these areas remaining intact. Where a silver halide emulsion is a reversal-type emulsion or where reversal processing is conducted, the binder layer remains in exposed areas, whereas a silver image is formed in the unexposed areas. Reversal-type emulsions and reversal-processings are well known in the art.

The photographic material is baked. Baking is conducted in an oxygen containing gas in order to preferentially remove the binder at the silver image areas. Oxygen is necessary to gasify the decomposed binder. That is, since the binder is an organic material and can comprise carbon, hydrogen, oxygen, nitrogen and sulfur, the decomposed binder requires oxygen to be gasified. The gases formed by baking depend on the type of binder. Gelatin usually contains C, H, N, and So, accordingly $CO_2$, $H_2O$, $NO_2$, and $SO_2$ are formed. On the other hand, polyvinyl acetate contains C and H but no N and S; accordingly only $CO_2$ and $H_2O$ are formed. Any oxygen containing gas can be used, such as a mixture of argon and oxygen, a mixture of hydrogen and oxygen, a mixture of carbon dioxide and oxygen, a mixture of air and oxygen, air, oxygen alone, etc. There are no particular limitations on the mixtures used so long as oxygen is present. Any mixtures can be used, with practical convenience deciding the mixture selected. The baking time is inversely proportional to the amount of oxygen. The most convenient $O_2$-containing as is air. When baking is conducted in a vacuum or an inert gas, the binder is not gasified even though the binder is decomposed. The decomposition point of the binder differs depending upon the kind of binder used. For example, alkali treated gelatin begins to decompose at a temperature of about 150° C. to 200° C., and turns yellow or brown. By baking at a higher temperature the binder turns dark red.

Surprisingly, it has been discovered that decomposed binder at the silver image areas is completely or almost completely removed by gasification, while decomposed binder at non-silver image areas remains upon baking the photographic material at a temperature ranging from about 350° to about 600° C., preferably about 400° to 600° C., for several minutes to several 10 minutes. That is, the binder at silver image areas is removed faster than the binder at the non-silver image areas. For instance, when a binder which mainly contains alkali treated gelatin at a thickness of 2μ at the non-image areas is baked at 450° C. in air, it takes about 5 minutes to remove the binder at the image areas, whereas it takes about 20 minutes to remove the binder at the non-image areas. Therefore, if baking is performed for 5 minutes, no binder remains at the image areas, while a considerable amount of decomposed binder remains at the non-image areas. The binderless silver image can be removed by dissolving it with a solvent. The binderless silver image is gray and not glossy, and the transmission optical density of the binderless silver image is much smaller than that before baking. The grayish appearance and low optical density of the binderless baked silver image is probably due to aggregation of silver particles and generation of pinholes or cracks. By baking, the silver image is degraded as described above; however, the decomposed but non-gasified binder image remaining, which corresponds to a negative of the silver image, surprisingly has a high optical density, non-grainy smooth edges, high contrast and high resolving power.

In addition, the decomposed but non-gasified binder layer remaining is water-impermeable and can act as a resist against aqueous etching solution. Furthermore, since the decomposed but non-gasified binder image is not substantially removed at a temperature range of 150° C. to 200° C., the decomposed binder image can be used as a heat resistant image.

The decomposed binder image exists in a negative-positive relationship to the original silver image, and the resolving power and contrast thereof are remarkably increased in comparison with the original silver image. It is believed one reason for the increase in the contrast and resolving power is due to the decrease in thickness of the binder layer by baking.

More surprisingly, it has been discovered that any fringe which exists in the original silver image disappears by the treatment of the present invention. That is, when a contact exposure is conducted on a silver halide emulsion layer through a master having a high surface reflectance, such as a chromium mask, the resultant silver image sometimes has a fringe due to multiple reflection in the emulsion layer; however, the fringe disappears by the treatment of the present invention, possibly because the amount of silver in the fringe is so small as compared with that of the image that the binder at the fringe is not preferentially removed. Since resolving power and contrast are remarkably deteriorated by the generation of fringe, these effects are very useful.

A known oxidizing agent such as nitric acid, sulfuric acid, ferricyanide (e.g., potassium ferricyanide, sodium ferricyanide, etc.), dichromate (e.g., potassium dichromate, sodium dichromate, etc.), permanganate (e.g., potassium permanganate, sodium permanganate, etc.), ferric chloride, cupric chloride, a mixture thereof, etc., can be used to dissolve the silver image. Representative dissolution conditions are: temperature: room temperature (20°–30° C.) to 50° C.; time: about 10 seconds to 5 minutes.

The second purpose of the present invention is attained by using a photographic material which comprises a transparent substrate having a masking layer thereon, the masking layer having thereon at least one silver halide emulsion layer either directly or on at least one subbing layer on the masking layer, and by conducting treatment as described above. That is, after the silver image is formed in the silver halide emulsion layer, the photographic material is baked to preferentially remove the binder at the silver image areas, then the image forming silver grains are dissolved to uncover the masking layer under the silver image, and finally the uncovered masking layer is etched away, e.g., using an etching solution as later described. If an etching solution for the masking layer can dissolve silver, dissolving of silver and etching of the masking layer can be conducted in one step, that is, at one time. Since the baked binderless silver image is porous as earlier described and the etching solution can reach the masking layer through the pores thereof, a separate dissolving of the silver image is not always necessary. In this case, the silver grains can easily be removed by rinsing in water after the masking layer is etched.

The kind of etching solution and the processing conditions for etching which can be used to remove the masking layer are those ordinarily used in the art. In etching, sputtering can be used as well as the more convenitonal chemical etching solutions.

Chemical etching as is used in the present invention includes the so-called etching with solutions which contain an oxidizing agent. Etching is effected using methods as are conventionally employed for the metal or the metal oxide, etc. Suitable etching solutions which can be used for chromium and chromium oxide ($Cr_2O_3$) include an aqueous solution of cerium ammonium nitrate (at a concentration of about 80 to 250 g/l) and 70 wt% perchloric acid (in an amount of about 20 to 80 ml/l) with an etching time of about 15 seconds to 10 minutes at a temperature of about 15° to 40° C., or an aqueous solution of cerium (IV) sulfate (at a concentration of about 40 to 200 g/l) and concentrated (98 wt%) sulfuric acid (in an amount of about 20 to 100 ml/l) with an etching time of about 20 seconds to about 10 minutes at a temperature of about 15° to 40° C., etc.; for iron oxide include an aqueous solution of hydrochloric acid (at a concentration of about 1 to 12 N) with an etching time of about 10 seconds to 4 minutes at a temperature of about 30° to 60° C., etc.; for silicon oxide include hydrofluoric acid in aqueous solution (at a concentration of about 6 to 48% by weight) with an etching time of about 10 seconds to 1 minute at a temperature of about 15° to 40° C.; a mixture of about 0.5 to 2 parts by volume of hydrofluoric acid (48% by weight aqueous solution) and about 6 to 24 parts by volume of ammonium fluoride (40% by weight aqueous solution) with an etching time of about 30 seconds to 5 minutes at a temperature of about 15° to 40° C., etc.; for nickel include an aqueous solution of ferric chloride (at a concentration of about 5 to 300 g/l) with an etching time of about 1 to 5 minutes at a temperature of about 15° to 45° C.; for titanium include an aqueous solution of hydrofluoric acid (at a concentration of about 5 to 40% by weight) with an etching time of about 20 seconds to 2 minutes at a temperature of about 20° to 40° C., etc.

After the etching of the masking layer, the decomposed but non-gasified binder remaining in the non-silver image areas is removed, if desired, by swelling or dissolving. The removal of the decomposed but non-gasified binder can be effected by using an alkali (e.g., an aqueous solution of sodium hydroxide or potassium hydroxide at a concentration of about 10 to 20% by weight at about 40° to 60° C. for about 2 to 10 minutes, etc.), an acid (e.g., a concentrated sulfuric acid (98% by weight) at about 60° to 98° C. for about 5 to 10 minutes, or concentrated nitric acid (70% by weight) at about 60° to 95° C. for about 2 to 10 minutes, etc.), or a salt (e.g., an aqueous solution of sodium hypochlorite or potassium hypochlorite at a concentration of about 4 to 10% by weight at about 30° to 60° C. for about 1 to 5 minutes, etc.). The removal of the remaining decomposed binder is not always necessary; for example, the binder can be left on the masking layer for protection of the masking layer, if desired.

The baking time primarily depends on the baking temperature and the thickness of the emulsion layer. The higher the baking temperature and the smaller the thickness of the emulsion layer, the shorter the baking time. A suitable baking temperature is not less than about 350° C., more preferably not less than 400° C. The upper limit depends on the softening point of the substrate. When the substrate is ordinary glass (e.g., soda lime glass), the upper limit is generally about 600° C. When ceramics are used as a support, the maximum baking temperature can be higher than 600° C. However, at a temperature higher than 600° C. the baking time becomes so small that it is difficult to control the baking time. Further, such a high temperature is not practically convenient.

The treatment of the present invention can be used to form a heat resistant and light resistant hologram. An amplitude hologram which has black and white interference fringes formed in a silver halide emulsion layer has a low diffraction efficiency. Consequently, it has been necessary to form a phase hologram by converting the silver fringes into transparent silver compound fringes through bleaching. A phase hologram has a higher diffraction efficiency, but has the defect that the diffraction efficiency gradually decreases because the silver compound is slowly reduced to silver by ambient ultraviolet light. According to the present invention, an amplitude hologram is baked in an oxygen containing gas and then silver grains are dissolved to form a phase hologram. The thus obtained phase hologram is heat resistant and light resistant, though the diffraction efficiency is smaller than that of a normal phase hologram.

The following examples are given to illustrate the invention in greater detail. Unless otherwise indicated, all parts, percents, ratios and the like are by weight.

EXAMPLE 1

1,400 ml of a silver bromide emulsion (mean grain size of silver bromide: about 0.06μ) was prepared using 50 g of gelatin and 188 g of silver bromide in a conventional fashion. To this emulsion was added 0.25 g of 4-methyl-2,3-di-ethoxathiazolocarbocyanine iodide to optically sensitize the emulsion to light of a wavelength of 510 mμ–530 mμ. The emulsion was coated to a dry thickness of about 6μ on a soda lime glass plate of a thickness of 1.6 mm, and then dried to obtain a light-sensitive photographic material. This photographic material was image-wise exposed (exposure conditions: tungsten light through a green filter for 3 sec.; intensity of light about 1,000 lux) and developed in a developer having the following composition (24° C., 5 min.), followed by fixing in a fixing solution having the following composition (24° C., 1 min.) to obtain a silver image.

| Developer | |
|---|---|
| 1-Phenyl-3-pyrazolidone | 0.5 g |
| Sodium Sulfite | 50 g |
| Hydroquinone | 12 g |
| Sodium Carbonate (monohydrate) | 60 g |
| Potassium Bromide | 2 g |
| Benzotriazole | 0.2 g |
| 1-Phenyl-5-mercaptotetrazole | 5 mg |
| Phenazine-2-carboxylic Acid | 1 g |
| Water to make | 1 l |
| Fixing Solution | |
| 70% Aqueous Ammonium Thiosulfate Solution | 200 ml |
| Sodium Sulfite | 15 g |
| Boric Acid | 8 g |
| Glacial Acetic Acid | 16 ml |
| Aluminum Sulfate | 10 g |
| Sulfuric Acid | 2 ml |
| Water to make | 1 l |

After rinsing in water and drying, the photographic material was heated in air at about 450° C. for 5 min.; the binder at the silver image areas was completely removed, though the silver image turned gray and lost its gloss. The decomposed but non-gasified gelatin at non-silver image areas had a sufficient optical density (the transmission optical density was about 3.6 at a wavelength of 450 nm). After cooling, the photographic material was immersed in an aqueous solution containing potassium dichromate at a concentration of 5 g/l and sulfuric acid at an amount of 10 ml/l for 30 sec. at room temperature to dissolve away the silver image. The decomposed gelatin at the non-silver image area remained intact.

The thus obtained decomposed gelatin image had very high resolving power, high contrast and smooth edges. 1μ lines were formed very well.

The image was heated in air at 150° C. for 50 hours but the optical image density was not changed.

EXAMPLE 2

The same silver halide emulsion as described in Example 1 (except that a mixture of 96 mol% silver bromide and 4 mol% silver iodide was used instead of silver bromide) was coated to obtain a dry thickness of 5μ on a chromium layer of a thickness of 0.1μ vacuum-deposited on a soda lime glass plate of a thickness of 1.6 mm, and then dried to obtain a photographic light-sensitive material.

The photographic material was then treated as described in Example 1 to form a silver image and then the photographic material was baked in air at 440° C. for about 5 min.

The photographic material was then immersed in the following etching solution for about 1 min. at room temperature. Both the silver image and the chromium layer at the silver image areas were etched away.

| Etching Solution | |
|---|---|
| Cerium Ammonium Nitrate | 164.5 g |
| 70% Perchloric Acid | 43 ml |
| Water to make | 1 l |

After rinsing in water, the photographic material was immersed for 3 min. in a 20% sodium hydroxide aqueous solution at 50° C. to remove the decomposed but non-gasified gelatin layer.

The thus obtained chromium mask, after rinsing in water and drying, exhibited excellent quality. 1μ lines were formed very well.

EXAMPLE 3

The procedure of Example 2 was conducted except that a vacuum-deposited chromium oxide ($Cr_2O_3$) layer of a thickness of 0.25μ was used instead of the chromium layer and the etching time was about 3 min. The same results as described in Example 2 were obtained.

EXAMPLE 4

Using the chromium oxide mask obtained in Example 3 as a master, contact printing was conducted on the photographic material obtained in Example 1. The thus-obtained silver image possessed 2 to 3 fringe lines around the image. However, the decomposed binder image obtained by conducting the same procedure as in Example 1 did not possess the fringe lines, and good results as described in Example 1 were obtained.

EXAMPLE 5

The same procedure as described in Example 1 was conducted except that the following procedures were conducted instead of fixing as in Example 1. That is, after the development process of Example 1, the silver image was bleached using a bleaching solution having the following composition (20° C., 2 min.) without fixing.

| Bleaching Solution | |
|---|---|
| Potassium Dichromate | 50 g |
| Sulfuric Acid (98% by weight) | 10 ml |
| Water to make | 1 l |

After rinsing in running water for 5 min., the photographic material was dried, then exposed to uniform light from a 500 W tungsten lamp at a distance of 2 m. for 2 min., and then the silver halide at the non-imagewise exposed areas was blackened using the same developer as in Example 1 (24° C., 5 min).

After rinsing in running water for 5 min., the photographic material was dried, then heated in air at 450° C. for 5 min. After cooling, the photographic material was processed in the same way as in Example 1, and the thus-obtained decomposed gelatin image resolved 1μ lines very well.

EXAMPLE 6

The same procedure as in Example 1 was conducted except that the baking temperature was 400° C. and the baking time was about 10 min. The thus-obtained decomposed gelatin image resolved 1μ lines, and the transmission optical density of the image was about 2.0 at a wavelength of 450 nm.

EXAMPLE 7

The same procedure as in Example 1 was conducted except that the baking temperature and time were 500° C. and 2.5 min., respectively. The transmission optical density of the thus-obtained decomposed gelatin image was about 3.4 at a wavelength of 450 nm, and the image resolved 1μ lines.

EXAMPLE 8

The same procedure as in Example 1 was conducted except that the thickness of the photographic emulsion layer was 2.5μ and the baking time was 2.5 min. The resolving power of the thus-obtained decomposed gelatin image was better than that obtained in Example 1. The transmission optical density of the image was about 1.5 at a wavelength of 450 nm.

EXAMPLE 9

An amplitude hologram was obtained using the same photographic material as described in Example 1. The diffraction efficiency of the hologram was about 0.2%. The hologram was then baking-processed as described in Example 1, and then silver was dissolved away as in Example 1. The thus-obtained hologram was heat and light resistant, and exhibited a diffraction efficiency of about 6%.

EXAMPLE 10

The same procedure as in Example 2 was conducted except for coating a subbing layer having the following composition on the chromium layer using an immersion method and drying for 15 minutes at 130° C. prior to coating the silver halide photographic emulsion.

Subbing Solution

A solution prepared by adding 0.45 g of nitrocellulose (nitrocellulose RS ⅛; made by Daisel Ltd.) and 10.0 g of acetone while stirring to a gelatin dispersion comprising:

| Gelatin | 0.4 g |
|---|---|
| Salicylic Acid | 0.12 g |
| Methanol | 0.18 g |
| Ethylene Chloride | 55.0 g |
| Acetone | 15.0 g |

Almost the same results as Example 1 were obtained.

While the invention has been described in detail and with reference to specific embodiments thereof, it will be apparent to one skilled in the art that various changes and modifications can be made therein without departing from the spirit and scope thereof.

What is claimed is:

1. A method for producing an image comprising forming a silver image in a photographic material which comprises a substrate having thereon at least one silver halide emulsion layer, either directly thereon or on at least one subbing layer on said substrate, by exposing, developing and fixing said photographic material, heating said photographic material at greater than 350° C. in an oxygen containing gas until the binder at the silver image areas is substantially removed, and then dissolving away the image-forming silver to leave thermally decomposed binder at the non-silver image areas.

2. The method of claim 1, wherein said heating is at about 400° C.

3. The method of claim 1, wherein said oxygen containing gas is air.

4. The method of claim 1, wherein said substrate is a glass plate, quartz, sapphire, a ceramic, silica, a metal, a semi-metal, a chalcogen glass, a porcelain enamel, a metal coated with a ceramic, a metal having an oxide layer thereon, carbon fibers or graphite.

5. The method of claim 1, wherein said silver halide emulsion layer comprises silver chloride, silver bromide, silver iodide, silver chlorobromide, silver bromoiodide, silver chlorobromoiodide or a mixture thereof.

6. The method of claim 5, wherein said silver halide emulsion comprises about 90 mol% or more silver bromide and not more than about 5 mol% silver iodide and the mean grain size of the silver halide grains is not more than about 0.1 micron and wherein the weight ratio of the silver halide to the binder of the emulsion is about 1:4 to about 6:1.

7. The method of claim 5, wherein said silver halide emulsion comprises about 50 mol% or more silver chloride and contains silver halide grains having a mean grain size of not more than about 1 micron.

8. A method for producing an image comprising:
(a) forming a silver image on a photographic material which comprises a transparent substrate having thereon a masking layer of a metal, a metal oxide, a semi-metal, a chalcogen glass, or a mixture thereof, said masking layer having thereon at least one silver halide emulsion layer, either directly or on at least one subbing layer on said masking layer, by exposing, developing and fixing said photograhic material;
(b) heating said photographic material at above 350° C. in an oxygen containing gas until the binder at said silver image areas is substantially removed;
(c) dissolving away the image-forming silver to uncover said masking layer lying thereunder; and
(d) then etching away said masking layer at the uncovered areas to leave said masking layer at the non-silver image areas.

9. The method of claim 8, wherein said heating is at above 400° C.

10. The method of claim 8, wherein said oxygen containing gas is air.

11. The method of claim 8, wherein said transparent substrate is a glass plate, quartz or sapphire.

12. The method of claim 8, wherein said masking layer is a layer of a material which transmits visible light and absorbs ultraviolet light.

13. The method of claim 8, wherein said metal oxide is silicon dioxide, chromium (III) oxide, ferric oxide, magnetic iron oxide (iron (II) iron (III) oxide), cuprous oxide, cupric oxide, nickel oxide, cobalt oxide, germanium oxide, cadmium oxide, titanium oxide, or tantalum oxide, said metal is chromium, aluminum, silver, titanium, cobalt, tungsten, tellurium, nickel, gold, platinum, iridium, palladium, rhodium, molybdenum, tantalum, a nickel-iron alloy, a nickel-chromium-iron alloy, an aluminum-iron alloy, a chromium-iron alloy, a chromium-aluminum alloy, a silicon-gold alloy, a titanium-aluminum alloy, a copper-beryllium alloy, a cobalt-iron alloy, a cobalt-nickel alloy, or a nickel-chromium alloy, said semi-metal is silicon or germanium, said chalcogen glass is As-S-Ge, As-Se-Ge or Ge-S, and said mixture thereof is chromium oxide on chromium.

14. The method of claim 12, wherein said masking layer transmits light of a wavelength not less than about 450 nm and absorbs light having a wavelength shorter than 450 nm.

15. The method of claim 8, wherein said masking layer has a thickness ranging from about 0.01 micron to 10 microns.

16. The method of claim 8, wherein said silver halide emulsion layer comprises silver chloride, silver bromide, silver iodide, silver chlorobromide, silver bromoiodide, silver chlorobromoiodide or a mixture thereof.

17. The method of claim 16, wherein said silver halide emulsion comprises about 90 mol% or more silver bromide and not more than about 5 mol% silver iodide and the mean grain size of the silver halide grains is not more than about 0.1 micron and wherein the weight ratio of the silver halide to the water-soluble binder of the emulsion is about 1:4 to 6:1.

18. The method of claim 16, wherein said silver halide emulsion comprises about 50 mol% or more silver chloride and contains silver halide grains having a mean grain size of not more than about 1 micron.

19. The method of claim 8, wherein said dissolving of silver and said etching of the masking layer are conducted using the same solution.

20. The method of claim 19, wherein said masking layer is chromium, chromium oxide or a mixture thereof.

21. The method of claim 8 further comprising removing the decomposed binder at the non-silver image areas to leave the masking layer at such areas.

22. The method of claim 21, wherein said removing of the decomposed binder is by swelling or dissolving the decomposed binder layer using a solution of an alkali, an acid or a salt.

23. The method of claim 22, wherein said salt is sodium hypochlorite or potassium hypochlorite, said acid is nitric acid or sulfuric acid, and said alkali is sodium hydroxide or potassium hydroxide.

24. The method of claim 8, wherein said etching is performed with an aqueous etching solution containing an oxidizing agent.

25. The method of claim 1, wherein said heating is carried out at 350°–600° C.

26. The method of claim 8, wherein said heating is carried out at 350°–600° C.

27. The method of claim 1, wherein said heating is carried out at 400°–600° C.

28. The method of claim 8, wherein said heating is carried out at 400°–600° C.

29. The method of claim 1, wherein said method consists essentially of said exposing, said developing, said fixing, said heating and said dissolving.

30. The method of claim 8, wherein said method consists essentially of said exposing, said developing, said fixing, said heating, said dissolving and said etching away.

* * * * *